United States Patent [19]
Fujihira

[11] Patent Number: 5,319,236
[45] Date of Patent: Jun. 7, 1994

[54] SEMICONDUCTOR DEVICE EQUIPPED WITH A HIGH-VOLTAGE MISFET

[75] Inventor: Tatsuhiko Fujihira, Matsumoto, Japan

[73] Assignee: Fuji Electric Co., Ltd., Japan

[21] Appl. No.: 913,493

[22] Filed: Jul. 14, 1992

[30] Foreign Application Priority Data

Jul. 19, 1991 [JP] Japan .................. 3-179859

[51] Int. Cl.$^5$ .................. H01L 29/40; H01L 27/02; H01L 29/68; H01L 29/78
[52] U.S. Cl. .................. 257/493; 257/492; 257/487; 257/494; 257/546; 257/271; 257/274; 257/328; 257/329; 257/355; 257/357; 257/366; 257/367; 257/369; 257/373; 257/393; 257/409
[58] Field of Search ............ 257/133, 139, 141, 168, 257/173, 261, 263, 264, 265, 268, 269, 271, 274, 282, 327, 328, 329, 339, 343, 355, 356, 357, 366, 367, 368, 369, 371, 372, 373, 387, 393, 394, 490, 491, 492, 493, 494, 495, 502, 546, 549, 550, 551

[56] References Cited

U.S. PATENT DOCUMENTS

| | | | |
|---|---|---|---|
| 4,928,159 | 5/1990 | Mihara et al. | 257/551 |
| 5,008,719 | 4/1991 | Schrantz | 257/261 |
| 5,047,358 | 9/1991 | Kosiak et al. | 257/369 |

Primary Examiner—Jerome Jackson
Assistant Examiner—Alice W. Tang
Attorney, Agent, or Firm—Parkhurst, Wendel & Rossi

[57] ABSTRACT

The invention provides a semiconductor device equipped with a high-voltage MISFET capable of forming a push-pull circuit on one chip by optimizing a junction-separation structure. In an n-channel MOSFET, when a potential is applied to the gate electrode, to the source electrode, and across the drain electrode and the semiconductor substrate to expand the depletion layer from the junction face of a semiconductor substrate and a well formed thereon, the leading edge of the depletion layer does not reach a low-concentration drain diffusion region formed on the well. When a potential is applied to the drain electrode, to the semiconductor substrate, and across the source electrode and the gate electrode to expand a depletion layer from the junction face of the low-concentration drain diffusion region and the well, and a depletion layer from the junction face of semiconductor substrate and the well, the depletion layers are connected with each other.

6 Claims, 8 Drawing Sheets

SEMICONDUCTOR DEVICE EQUIPPED WITH A HIGH-VOLTAGE MISFET

FIELD OF THE INVENTION

The present invention relates to a semiconductor equipped with a high-voltage metal insulator semiconductor field effect transistor MISFET, and more particularly to its voltage breakdown structure.

BACKGROUND OF THE INVENTION

Semiconductor devices equipped with a high-voltage MISFET for use in the area of power electronics require a voltage breakdown performance of about 100V or higher. Various voltage breakdown structures have been proposed. One representative MISFET with a voltage breakdown structure is shown in FIG. 7. In this figure, the numeral 41 represents a p-channel type metal oxide semiconductor field effect transistor MOSFET, the surface of an $n^-$-type semiconductor substrate 42 with a $p^-$-type low concentration drain diffusion 43a, a drain region 43 equipped with a $p^+$-type high concentration drain diffusion region 43b as an ohmic contact, a $p^+$-type source diffusion region 44, and a gate layer 46 formed on a gate oxide film 45. A field oxide film 47 on the surface of the low concentration drain diffusion region 43a has a thickness greater than the gate oxide film 45, and the boundary of the field oxide film 47 with the gate oxide film 45 forms a step. The gate layer 46 extends to directly above the low concentration drain diffusion region 43a beyond this step. This extended part functions as a field plate, thereby raising the voltage between the source and the drain. At the same time, the source diffusion region 44 has an $n^+$-type contact region 48 formed on its side, a source electrode 49 being electroconductively connected also to the $n^-$-type semiconductor substrate 42. These arrangements prevent the occurrence of a latch-up phenomenon. In addition, a drain electrode 50 is electroconductively connected to the high concentration drain diffusion region 43b, and a gate electrode 51 is electroconductively connected to the gate layer 46. If the p-channel MOSFET 41 having this structure has the conductivity type of each part reversed, an n-channel MOSFET 61, as shown in FIG. 8, will result. In this figure, the structure of the n-channel MOSFET 61 is the same as that for the p-channel MOSFET 41, whereas each corresponding part is given the same numeral, and its explanation is omitted.

As described above, the MOSFETs shown in FIGS. 7 and 8 are so structured so that they can resist the breakdown voltage between the source and drain and prevent a latch-up phenomenon. Therefore, a semiconductor device independently constructed using these MOSFETs will exhibit a stable operation. However, because those MOSFETs form MOS sections directly on the semiconductor substrate, the semiconductor device has a problem in that it cannot meet the following requirement. That is, the circuitries have become more complex in recent years as the level of control has been elevated in the area of power electronics. As a result, a great burden has been imposed on system designs. Therefore, there have been attempts to reduce this burden by integrating MOSFETs with different conductivity types and control circuits into one chip. However, as long as the MOS section with a conductivity type corresponding to the substrate conductivity type is formed, it is not possible to form the p-channel MOSFET 41 shown in FIG. 7 and the n-channel MOSFET 61 shown in FIG. 8 on one substrate, so that the above requirement cannot be met, and a device incorporating a push-pull output and a bridge output in one chip cannot be realized.

Accordingly, one concept that eliminates the above problem calls for the adoption of a CMOS structure as in a low voltage MOSFET. However, in the high voltage MOSFET, it is necessary to have a structure that can handle a breakdown voltage at a level not influenced by the operating conditions in the semiconductor region formed on one substrate, as well as a structure that can withstand voltages in the lateral direction. Therefore, an insulation separating structure using embedded layers utilizing an epitaxial film-forming process has been considered but is not practical because of its excessive manufacturing costs. In view of the above problems, the present invention is intended to provide a semiconductor device equipped with both a high-voltage n-channel MISFET and high-voltage p-channel MISFET capable of creating a push-pull circuit in one chip by optimizing the separation structure in addition to adopting a junction separation structure as in the low-voltage MOSFET.

SUMMARY OF THE INVENTION

In order to solve the above problems, the present invention provides a semiconductor device equipped with a high-voltage MISFET in which a well of a second conductivity type are formed on the surface of a semiconductor substrate of a first conductivity type, and an MIS section of a first conductivity type is formed on the surface of the well, so that when a high voltage is applied between the semiconductor substrate and the gate layers of the MIS section, the source region of the first conduction conductivity type, and a drain region of the first conductivity type to expand a first depletion layer from a junction face of said semiconductor substrate with said well, the diffusion depth of said well and said drain region and the impurity dosage are set so that the leading edge of the first depletion layer is positioned between said junction face and the drain region, or in other words, the diffusion depth of the well and the drain region and the impurity dosage are set so that the depletion layer does not reach the drain region. In the present invention, the required high voltage is a voltage determined by the circuitry of the semiconductor device, which, for example, is equivalent to the breakdown voltage required by the MISFET, or the voltage applied across the source and drain.

Furthermore, when a high voltage is applied between a source region or a gate layer and the drain region or the semiconductor substrate to expand a second depletion layer from a junction face of the drain region and the well, and to expand a third depletion layer from the junction face of the semiconductor substrate with the well, the diffusion depth of the well and the drain region and the impurity dosage is set so that these depletion layers will become connected with one another to form an integrated depletion layer before avalanche breakdown can occur.

In order to assure the breakdown voltage across the source and drain and prevent the occurrence of a latch-up phenomenon, the drain region is structurally equipped with a low concentration region of the first conductivity type opposite the source region and a high concentration drain region of the first conductivity type electroconductively connected to the drain electrode formed on the surface of this low concentration drain region. Then the gate electrode is extended to directly above the low concentration drain region over the surface of a field oxide film which is thicker than the gate oxide film, and the source electrode electroconductively connected to the source region should also is electroconductively connected to a high concentration contact region of the second conduction type formed on the surface of the well. Moreover, the surface of the low concentration drain region facing the boundary of the gate oxide film and the field oxide film should be disposed with an electric field strength relaxing layer of the second conductivity type.

In order to meet the above requirements, the device may be arranged, from the viewpoint of impurity diffusion technique, so that the semiconductor substrate has an impurity concentration of the first conductivity type at about $3 \times 10^{12}$ ions/cm$^3$ or less, the well has an impurity dosage of a second conductivity type at about $3 \times 10^{--}$ ions/cm$^2$ or less, and the low concentration drain region has an impurity dosage of a first conductivity type at about $5 \times 10$ ions/cm$^2$ or less. From the aspect of the structural technology, it may be arranged so that the well has a diffusion depth ranging from about $2 \mu m$ to about $10 \mu m$, while the low concentration drain region has a diffusion depth ranging from about $0.5 \mu m$ to about $5 \mu m$, this depth being separable from the well.

The effects of the present invention are explained using, as a representative example, a case in which said MIS section and an MIS section with a different conductivity type, constructed on the surface of the same substrate, constitute a CMOS structure. As shown in FIG. 6, the surface of the n-type semiconductor substrate 31 is formed with a p-well 32 and a p-channel MISFET 33, the surface of the p-well 32 being formed with an n-channel MISFET 34. The drain region 34b of the n-channel MISFET 34 and the drain region 33a of the p-channel MISFET 33 are electroconductively connected, the source region 34b of the n-channel MISFET 34 is grounded, and the source region 33b of the p-channel MISFET 33 is applied with a positive potential $V_{DD}$.

In such a semiconductor device, according to the present invention, when a potential, the potential $V_{DD}$ for example, is applied between the semiconductor substrate 31 and the gate layer 34c on the n-channel MISFET 34 (MIS section), the source region 34b (a source region of the first conductivity type), and the drain region 34a (a drain region of the first conduction type) to expand the first depletion layer from the junction face 35 of the semiconductor substrate 31 with a p-well (a well), the leading edge of the first depletion layer is positioned between the junction face 35 and the drain region 34a, whereas the depletion layer does not reach the drain region 34a, and the drain region 34a, the p-well 32 and the semiconductor substrate 31 have n-p-n structure transistor bases that remain grounded. Therefore, the voltage breakdown performance is so high that no breakdown can occur and the longitudinal voltage breakdown can be assured even if the potential $V_{DD}$, for example, remains applied to the drain region 34a and across the source region 34b and the semiconductor substrate 31, while the n-channel MISFET 34 is on and the p-channel MISFET 33 is off.

Furthermore, when the potential $V_{DD}$ is positive with respect to the source region 34b and the gate layer 34c is applied to the drain region 34a and the semiconductor substrate 31 to expand the second depletion layer from the junction face 35 of the drain region 34a with the p-well 32, and expand the third depletion layer from the junction face of the semiconductor substrate 31 with the well 32, if these depletion layers are arranged so that they are connected with each other, the p-well 32 directly below the drain region 34a, that is the p-well 32 between the drain region 34a and the semiconductor substrate 31, will be completely depleted even if the n-channel MISFET 34 has been turned off and the p-channel MISFET 33 has been turned on. Therefore, the p-well 32 in this region has no zero volt potential region, while only the perimeter of the source region 34b has a zero volt potential. Therefore, the electric field intensity is kept sufficiently low, so that no breakdowns can occur in the source region 34b or between the drain source 34a and the semiconductor substrate 31, and the voltage breakdown performance can be assured.

Thus, the voltage breakdown performance is assured at the semiconductor substrate and the n-channel MISFET 34, and the p-channel MISFET 33 or a control can be formed in the other regions of the semiconductor substrate.

DETAILED DESCRIPTION OF THE PREFERRED EMBODIMENTS

A semiconductor device equipped with high-voltage MOSFET according to the present invention will now be explained with reference to FIGS. 1-8.

Figure 1:
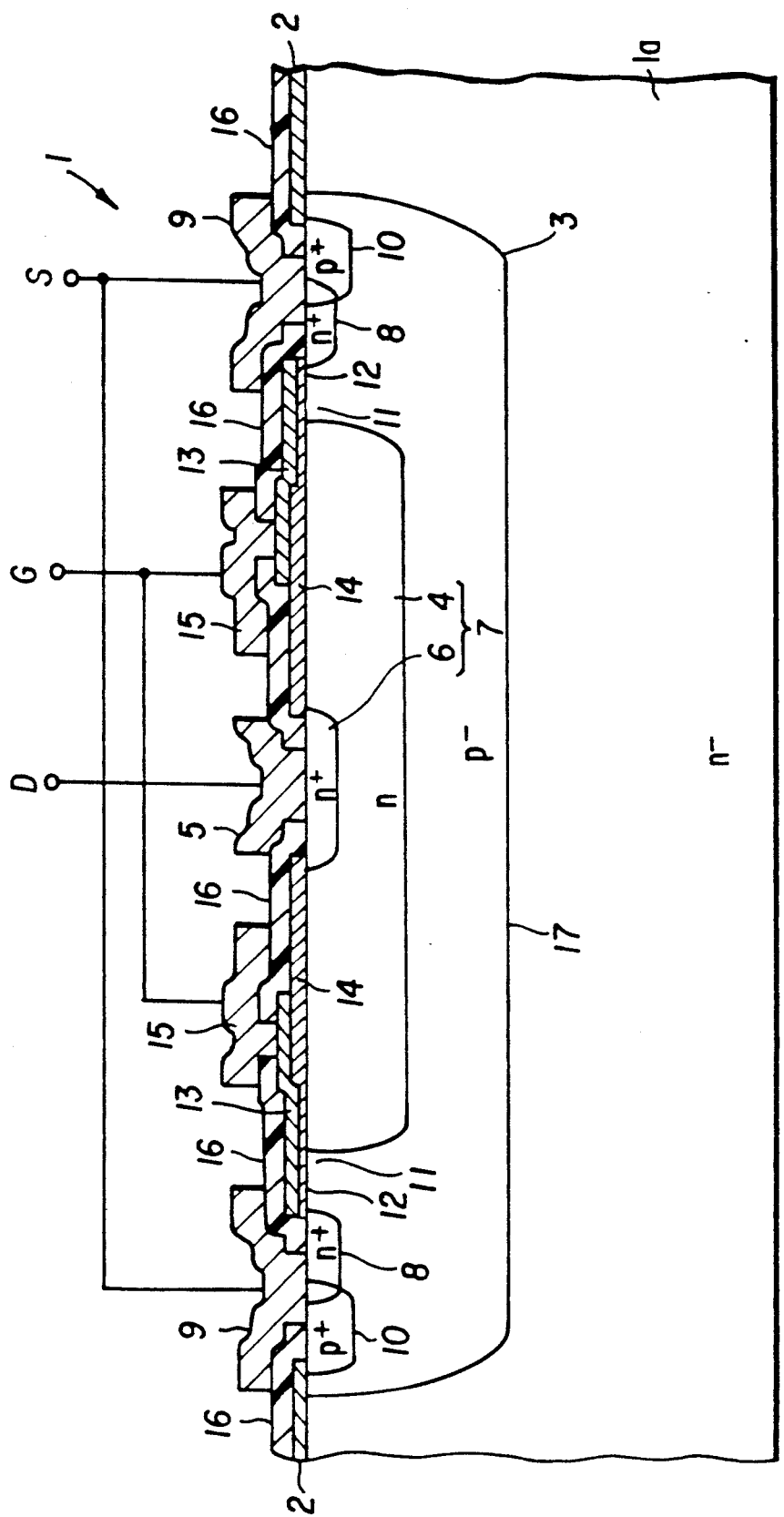
FIG. 1 is a cross section of a semiconductor device equipped with a high-voltage MISFET according to the present invention.
Figure 2:
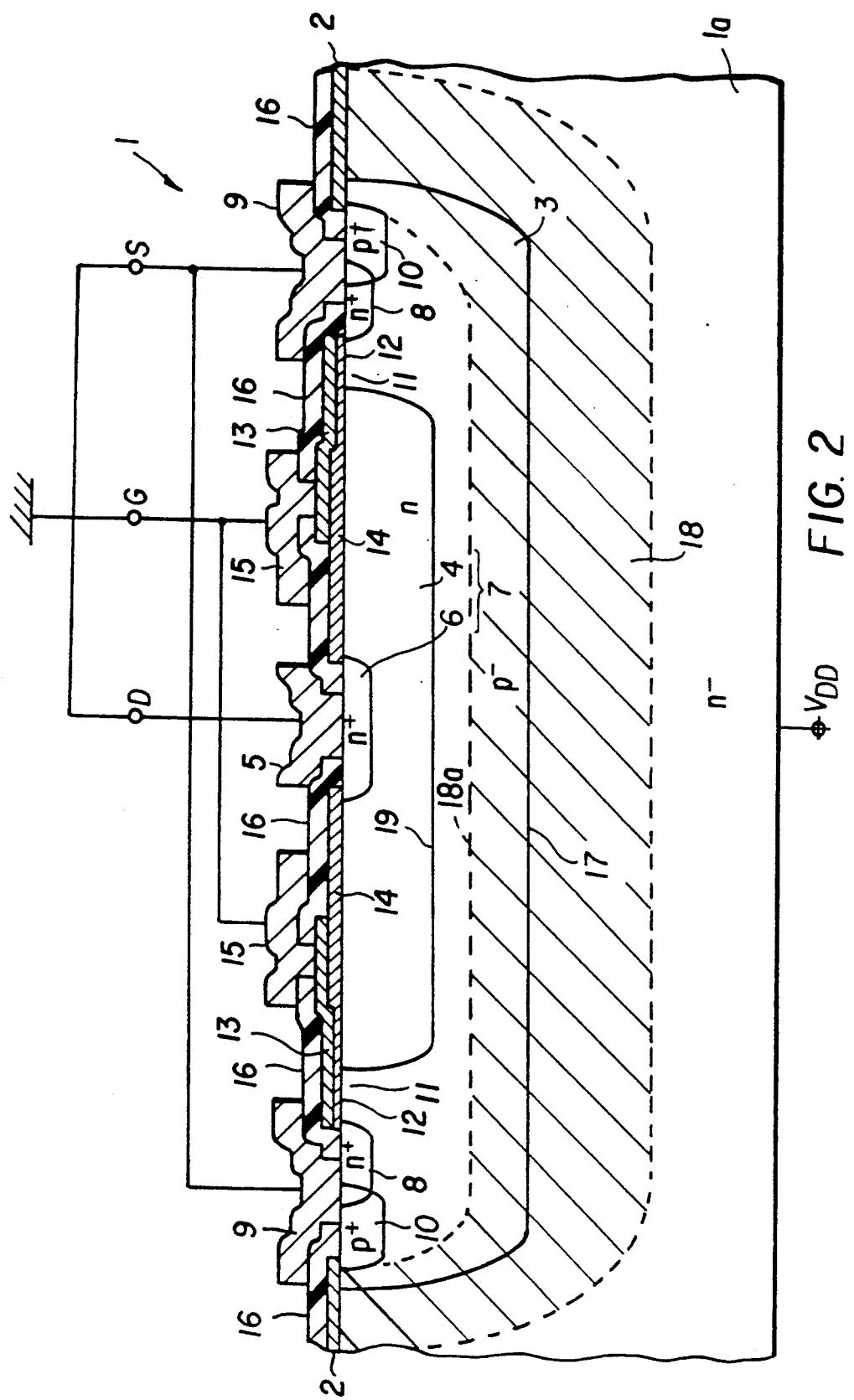
FIG. 2 is a cross section of a semiconductor device equipped with a high-voltage MISFET as in FIG. 1, with a depletion layer expanded from the junction face of the well and the semiconductor substrate.

FIG. 1 illustrates a cross section of the n-channel MOSFET according to the present invention. In this figure, the numeral 1 represents an n-channel MOSFET, with an n$^-$-type semiconductor substrate 1a surface formed with field oxide films 2 and p$^-$-wells 3 extending to the other regions. The semiconductor substrate used has an impurity concentration of about $3 \times 10^{14}$ ions/cm$^3$ or less, and the p$^-$-well 3 has a dosage that is set to about $3 \times 10^{13}$ ions/cm$^2$ or less, and its diffusion depth is set within a range between about $2 \mu m$ and about $10 \mu m$. The surface of this p$^-$-well 3 has a drain region 7 disposed with a low concentration drain diffusion region 4 of the n-type at a relatively low concentration with a dosage of about $5 \times 10^{12}$ ions/cm$^2$ or less, for example, and a high concentration drain diffusion region 6 of n$^+$-type at a relatively high concentration as an ohmic contact, as well as the n$^+$-type source region 8 opposite the low concentration drain diffusion region 4 via the surface of the p$^-$-well 3. The diffusion depth of the low concentration diffusion region 4 is set within a range between about 0.5 $\mu$m and about 5 $\mu$m. As will be described in greater detail below, the depth of the p$^-$-well 3 and the low concentration drain diffusion region 4 are set so that a leading edge 18a of a depletion layer 18, formed when a voltage is applied to the semiconductor substrate 1a, is positioned between the p-n junction face 17 of the semiconductor substrate 1a and the p$^-$-well 3 and another p-n junction face 19 of the low concentration drain diffusion region 4 and the p$^-$-well 3 as shown in FIG. 2. The source electrode 9 electroconductively connected to the source diffusion region 8 is also electroconductively connected to the p$^-$-well 3 via the [n] p$^+$-type contact region 10 formed on the surface of the p$^-$-well 3, which has a structure that prevents the occurrence of the latch-up phenomenon. The surface of the p$^-$-well 3 between the source diffusion region 8 and the low concentration drain diffusion region 4 forms an n-channel formed region 11, which has a surface with the gate layer 13 disposed on the opposite side via the thin gate oxide film 12. The gate oxide film 12 is formed next to the field oxide film 14 that is thicker than the gate oxide film and extends laterally. The gate layer 13 extends next to the surface of this field oxide film 14 to directly above the low concentration drain diffusion region 4 and functions as a field plate raising the breakdown voltage for the source diffusion region 8 and the drain region 7. This gate layer 13 is electroconductively connected with the gate electrode 15. The numeral 16 shows an inter-layer insulation film.

Figure 7:
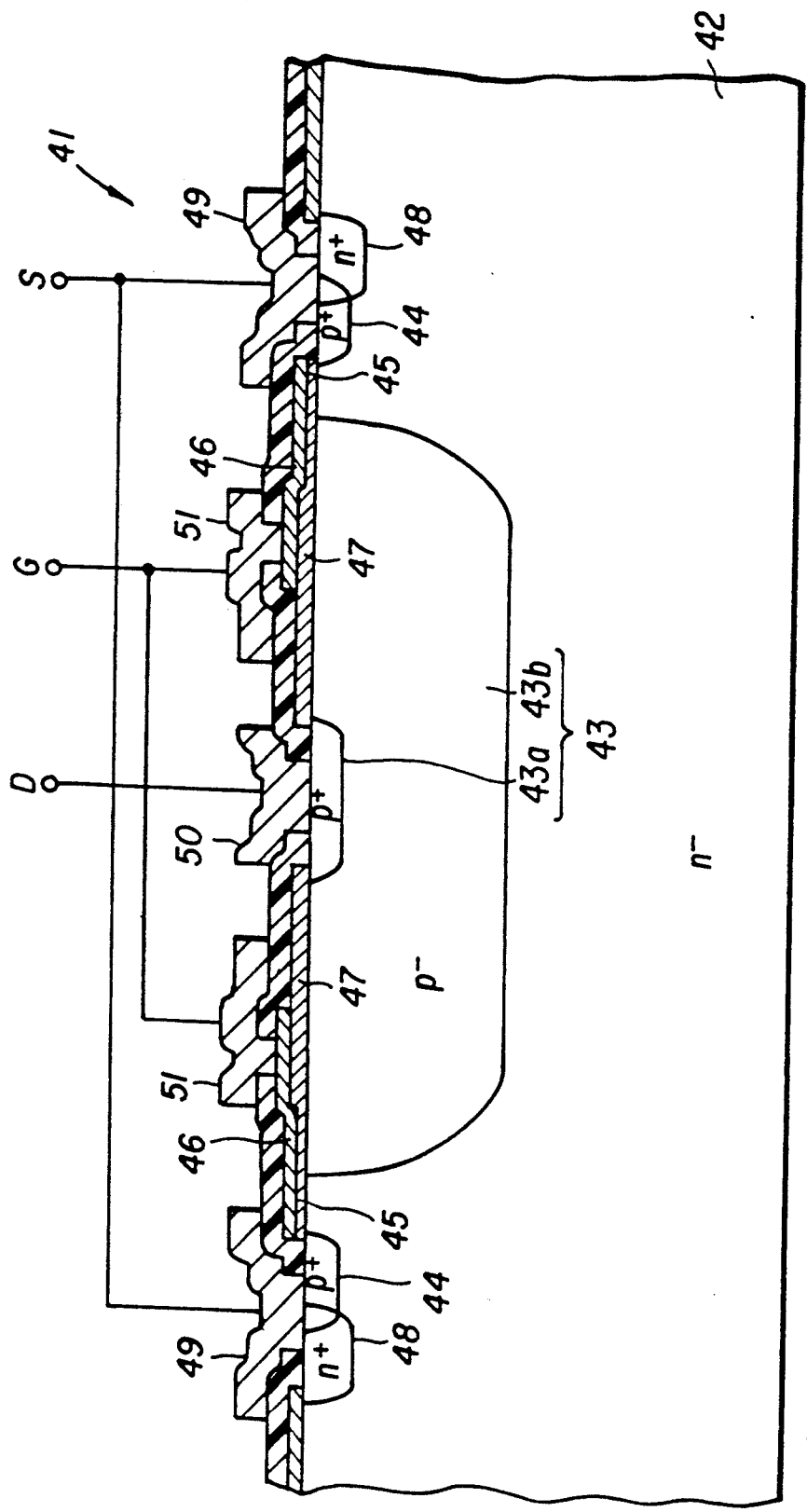
FIG. 7 is a cross section of a semiconductor device formed with only a high-voltage p-channel MOSFET.
Figure 8:
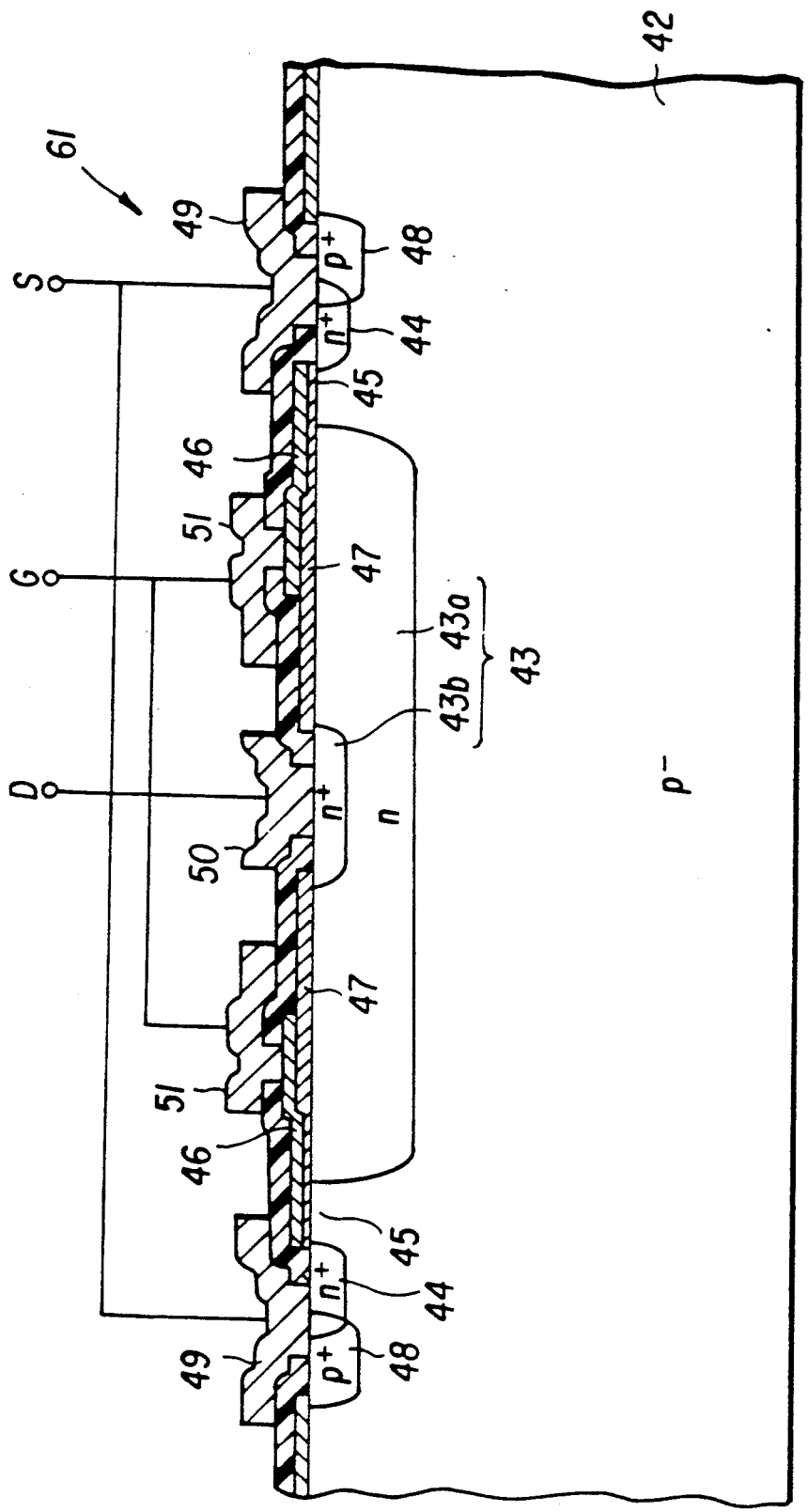
FIG. 8 is a cross section of a semiconductor device formed with only a high-voltage n-channel MOSFET.

The semiconductor substrate 1a of this configuration has its other regions formed with a low voltage CMOS section (not shown) which constitutes a control circuit, as well as a p-channel MOSFET with the same construction as the p-channel MOSFET 41 shown in FIG. 7, constituting the n-channel MOSFET 1 and the CMOS construction (hereinafter referred to as the p-channel MOSFET 41).

The breakdown voltage in the longitudinal direction for the n-channel MOSFET 1 is assured to be high under the following conditions.

First, as shown in FIG. 2, when the gate electrode 15, the source electrode 9, and the drain electrode 5 in the n-channel MOSFET 1 are all grounded, and a potential is applied to the semiconductor substrate 1a, the positive potential $V_{DD}$ corresponding to the power source voltage, for example, to expand the first depletion layer 18 (shown by the diagonal lines in FIG. 2) from the p-n junction face 17 of the semiconductor substrate 1a with the p$^-$-well 3, the leading edge 18a of the first depletion layer 18 is positioned between the p-n junction face 17 and the low concentration drain diffusion region 4, and the depletion layer 18 does not reach the p-n junction face 19 of the low concentration drain diffusion region 4 with the p$^-$-well 3. Therefore, even under these conditions, the breakdown voltage at the low concentration drain diffusion region 4 and between the source diffusion region 8 and the semiconductor substrate (1a), that is, the breakdown voltage in the longitudinal direction of the n-channel MOSFET 1, can be maintained at a high level because the low concentration drain diffusion region 4, the p$^-$-well 3, and the semiconductor substrate 1a have their n-p-n transistor bases grounded. Therefore, even when the n-channel MOSFET 1 and the p-channel MOSFET 41 are formed on the same semiconductor substrate 1a to make up CMOS construction, no breakdown voltage is generated among them, and the withstand voltage at the semiconductor substrate is maintained at a high level when the n-channel MOSFET 1 is turned on and the p-channel MOSFET 41 is turned off even if the potential $V_{DD}$, for example, is applied directly between the semiconductor substrate 1a and the low concentration drain diffusion region 4, the source diffusion region 8 and the semiconductor substrate 1a.

Figure 3:
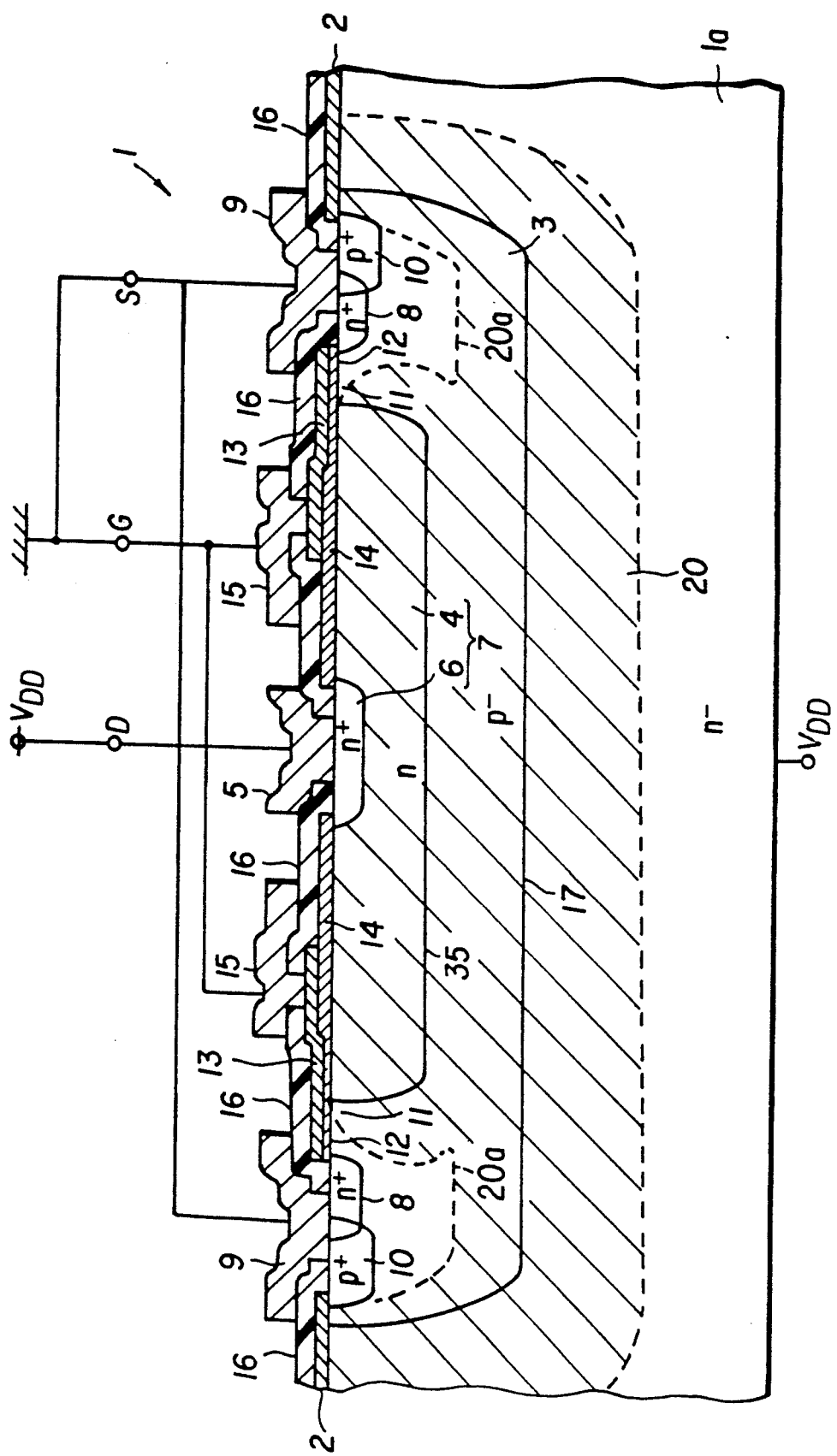
FIG. 3 is a cross section of a semiconductor device equipped with a high-voltage MISFET as in FIG. 1, with a depletion layer expanded from the junction face of the well and the semiconductor substrate and from the junction face of the drain region and the well.

Furthermore, as shown in FIG. 3., when the source electrode 9 and the gate electrode 15 are grounded, and the drain electrode 5 and the semiconductor substrate 1a have a positive potential $V_{DD}$ (corresponding to the drive voltage) applied to them for example, to expand the second depletion layer from the p-n junction face 35 of the low concentration diffusion region 4 with the p$^-$-well 3, and to expand the third depletion layer from the p-n junction face 17 of the semiconductor substrate 1a with the p$^-$-well 3, the second depletion layer and the third depletion layer are connected with each other, and set in a way that they form an integrated depletion layer 20, with the depletion layer 20 spreading thereon except on the source diffusion region 8 and the perimeter 20a of the contact region 10. Therefore, the potential distribution directly below the drain region 7 under these conditions takes the form as shown in FIG. 4.

Figure 4:
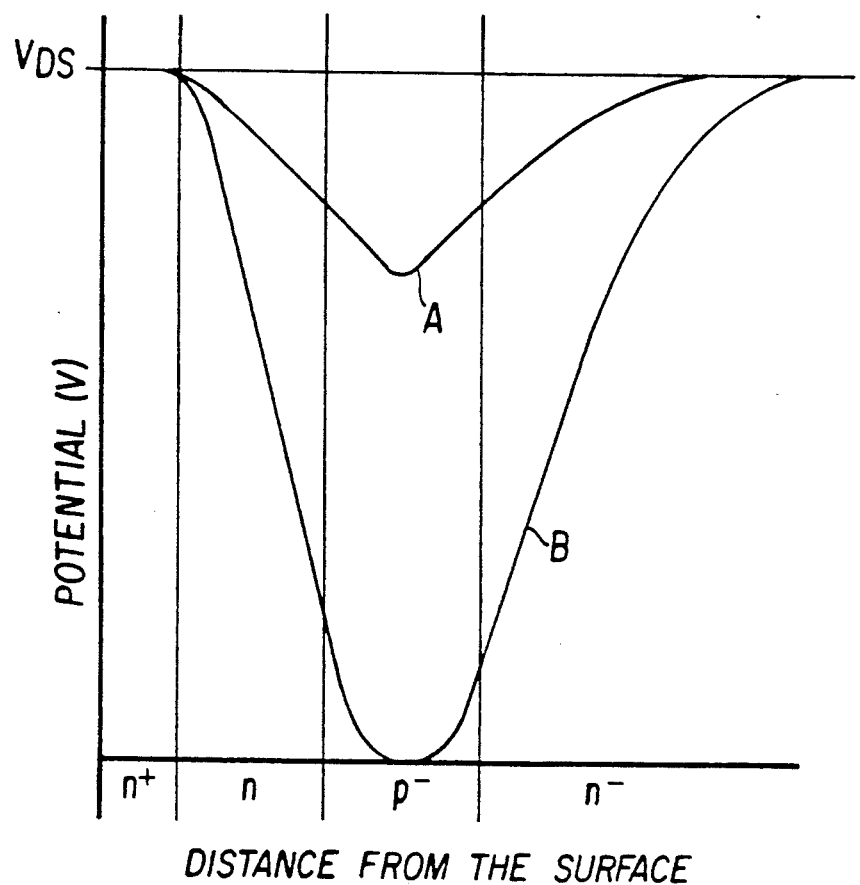
FIG. 4 is a graph showing the potential distribution directly below the drain region under the conditions shown in FIG. 3.

In FIG. 4, the axis of the abscissa represents the distance from the surface (indicated by the conductivity type of each region), while the axis of the ordinate shows the potential. The curve A indicates the potential distribution of the n-channel MOSFET 1 with this embodiment, and the curve B shows the potential distribution in a comparative example where the second depletion layer expanded from the p-n junction face 19 of the low concentration drain diffusion region 4 with the p$^-$-well 3 does not connect with the third depletion layer expanded from the p-n junction face 17 of the semiconductor substrate 1a with the p$^-$-well 3. In other words, the comparative example refers to a case there the p$^-$-region (p$^-$-well 3) remains directly below the low concentration drain diffusion region 4. In the figure, the high concentration drain diffusion region 6 and the semiconductor substrate 1a have a potential $V_{DS}$ corresponding to the source to drain voltage ($V_{DD}$ in this embodiment). Because in the comparative example a region that has not been depleted exists in the p$^-$-well 3 directly below the drain region 7 as shown by the curve B in the figure, the potential in that region decreases to zero volts, raising in turn the potential intensity (corresponding to the gradient of the curve). As opposed to this example, because the p$^-$-well 3 is depleted completely as shown by the curve A, the potential there does not decrease to zero volts, thereby making the potential intensity low. For this reason, because the potential intensity is low in this embodiment, the breakdown voltage at the source region 8 and across the drain region 7 and the semiconductor substrate 1a is high, thereby assuring the breakdown voltage of the semiconductor device 1. Therefore, in the case where the n-channel MOSFET 1 and the p-channel MOSFET 41 are formed on the same semiconductor substrate 1a resulting in a CMOS construction, even if the voltage $V_{DD}$, for example, is applied between the drain regions 7 or the semiconductor substrate 1a and the source diffusion region 8, and the drain region 7, when the n-channel MOSFET 1 is off and the p-channel MOSFET 41 is on, the depletion layer 20 expands to maintain a high breakdown voltage and the breakdown voltage at the semiconductor device 1 high.

Next, the method used to manufacture the semiconductor device is explained hereunder, applying the assumption that the p-channel MOSFET 41 is formed simultaneously on the surface of the semiconductor substrate 1a, in addition to the n-channel MOSFET 1.

First, the semiconductor substrate 1a with an n⁻-type impurity at a concentration of $3 \times 10^{13}$ to $3 \times 10^{14}$ ions/cm³ and a thickness of about 500 μm is subjected to steam oxidation in an atmosphere at a temperature of about 1100° C. for about four hours. This forms a thermal oxide film of about 1 μm on the surface of the semiconductor substrate 1a. The oxide film is then etched by photolithography and buffered hydrofluoric acid is used to open windows on predetermined regions. The thermal oxide film that remains on the surface as a result of this process is the field oxide film 2.

Next, an accelerated voltage injects ions from above the resist mask formed by photolithography under approximately 100 keV, and injects boron ions at a dosage of $1 \times 10^{13}$ to $3 \times 10^{13}$ ions/cm² into the semiconductor substrate 1a. After this injection, the resist mask is removed, and the semiconductor substrate 1a is heat-treated in an atmosphere at a temperature between 1100 and 1150° C. for two to ten hours to diffuse the ions and form a low-concentration drain diffusion layer 43a on the p-channel MOSFET 41 and the p⁻-well 3 on the n-channel MOSFET 1. The depth of the diffusion is set within a range of 2 to 10 μm.

Then, the semiconductor substrate 1a is subjected to steam oxidation in an atmosphere at a temperature at about 1100° C. for about 2.5 hours to form a thermal oxide film measuring about 0.8 μm, followed by etching by photolithography and with buffered hydrofluoric acid to form a resist mask which has windows opened around the area selected for the formation of the low-concentration drain diffusion region 4. Under these conditions, an accelerated voltage injects ions from above the resist mask under approximately 100 keV, and injects phosphorus ions at a dosage of $1 \times 10^{12}$ to $5 \times 10^{12}$ ions/cm² into the semiconductor substrate. After this injection, the resist mask is removed, and the semiconductor substrate 1a is heat-treated in an atmosphere at a temperature at 1100° C. for two to ten hours to form a low-concentration drain diffusion layer 4 on the n-channel MOSFET 1. The depth of the diffusion is set to within a range of 0.5 to 5.0 μm.

Figure 5:
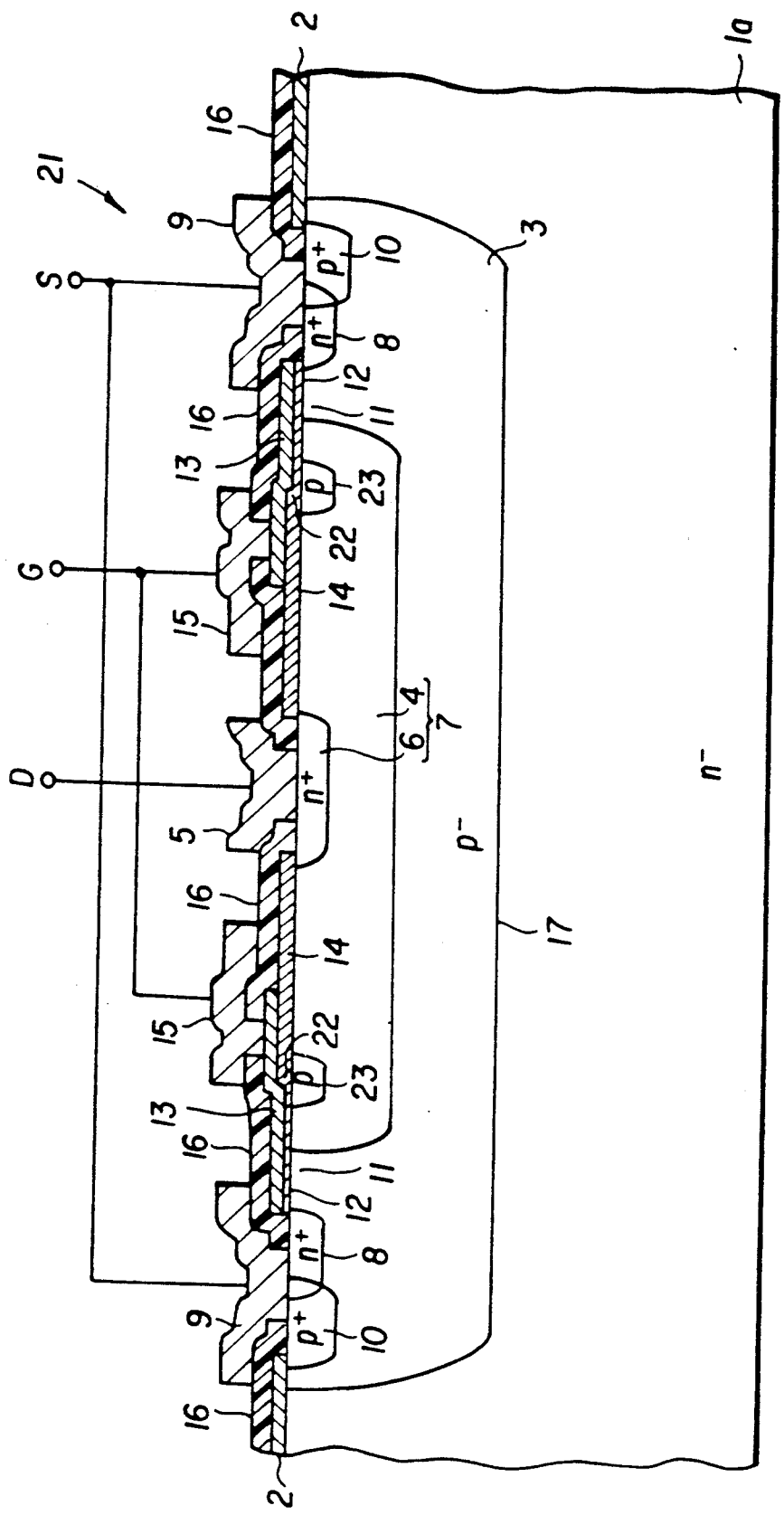
FIG. 5 is a cross section of a semiconductor device equipped with a high-voltage MISFET in FIG. 1, disposed with an electric field intensity relaxation layer.
Figure 6:
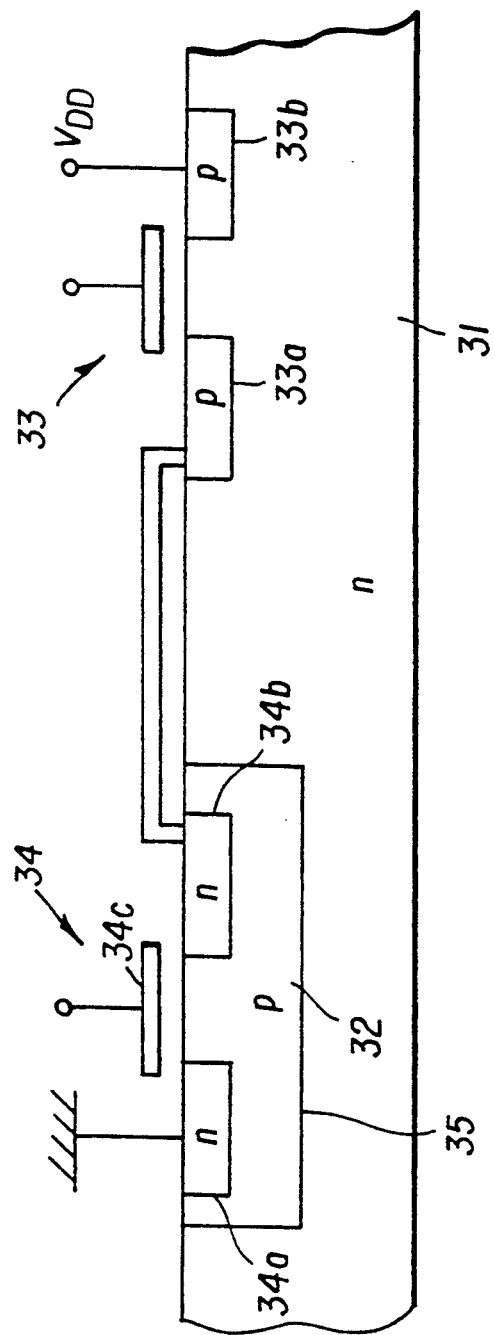
FIG. 6 is a conceptual drawing of a common CMOS semiconductor device.

Next, the semiconductor substrate 1a can be etched by photolithography to form a resist mask which has windows opened around the area selected for the formation of a p-type electric field relaxation layer 23, which will be described in greater detail below, as shown in FIG. 5. Under these conditions, an accelerated voltage injects ions from above the resist mask under approximately 100 kev, and injects boron ions at a dosage of $1 \times 10^{12}$ to $1 \times 10^{14}$ ions/cm₂ into the semiconductor substrate, After this injection, the resist mask is removed, and the semiconductor substrate 1a)is heat-treated in an atmosphere at a temperature at 1000 to 1100 degrees centigrade for half an hour to three hours to form p-type electric field relaxation layer 23.

Next, the semiconductor substrate 1a is subjected to dry oxidation in an atmosphere at a temperature of about 1100° C. for about one hour to form a thermal oxide film measuring about 0.5 μm. The oxide film is etched by photolithography and with a buffered hydrofluoric acid to form field oxide films 14, 47.

Next, the semiconductor substrate 1a is subjected to dry oxidation in an atmosphere at a temperature at about 1000° C. for about one hour to form the gate oxide films 12, 45 with a thickness of about 200Å.

Next, polycrystalline silicon is deposited on the semiconductor substrate via the CVD process, then injected with ions under approximately 50 keV, and phosphorus ions are injected at a dosage of about $5 \times 10^{15}$ ions/cm². After this injection, the substrate is activated by being heat-treated in an atmosphere at a temperature of about 1000° C. for about 30 minutes. Thereafter, the gate layers 13, 46 are formed through photolithography and dry etching, with poly-crystalline silicon left on only the predetermined areas.

Subsequently, after the resist mask is formed, windows are opened and an accelerated voltage selectively injects boron ions at a dosage of about $5 \times 10^{15}$ ions/cm² under approximately 50 keV, and the resist mask is removed. Furthermore, after the resist mask is formed, windows are opened and an accelerated voltage selectively injects arsenic ions at a dosage of about $5 \times 10^{15}$ ions/cm², and the resist mask is removed. Thereafter, the substrate is activated by being heat-treated in an atmosphere at a temperature of about 1000° C. for about 30 minutes. As a result, the contact region 10, the source diffusion region 8, and the high-concentration drain diffusion region 6 on the n-channel MOSFET 1 side, and the contact region 48, the source diffusion region 44, and the high-concentration drain diffusion region 43b on the p-channel MOSFET 41 side are all formed sequentially.

Next, a BPSG (boron phosphorous glass) film is deposited, and is then heat-treated in an atmosphere at a temperature of about 1000° C. for about 30 minutes. Subsequently, windows are opened in predetermined regions to leave the inter-layer insulation film 16, through photolithography and dry etching.

Thereafter, an aluminum-silicon film of about 1 μm is deposited, and the electrodes 9, 15, 5, 49, 51, 50 and the wiring layer are left in predetermined regions, through the photolithography and dry etching.

The above-mentioned processes simultaneously form the n-channel MOSFET 1, and the p-channel MOSFET 41 which constitute a MOSFET and CMOS on the surface of the semiconductor substrate 1a. Since expensive processes such as the epitaxial film formation process are not applied, this manufacturing method can be practically applied while costs are kept low.

The n-channel MOSFET 21 shown in FIG. 5 may be formed, during the formation of the field oxide films 14, 47 and gate oxide films 12, 45 as described above, by forming a resist mask which leaves windows opened in predetermined regions on the surface of the low-concentration drain diffusion region 14 on the n-channel MOSFET 1 using photolithography and etching, removing the resist mask after an accelerated voltage has injected boron ions at a dosage of $1 \times 10^{13}$ ions/cm² from above this resist mask at about 30 keV, and activating the semiconductor substrate 1a by heat-treating it in an atmosphere at a temperature at about 1000° C. for about 30 minutes.

Since this n-channel MOSFET 21 has the same configuration as the no-channel MOSFET 1 shown in FIG. 1, the corresponding parts are shown with the same numerals, and their explanation is omitted, except that the surface of the low concentration drain diffusion region 4 corresponding to the step or boundary 22 between the thin gate oxide film 12 and the field oxide film 14 thicker than the gate oxide film includes the p-type electric field relaxation layer 23. Therefore, a high electric field intensity is generated in the low-concentration drain diffusion region 4 by the gate layer 13 at the step 22 between the gate oxide film 12 and the field oxide film 14, that is, the edge of a region functioning substantially as a gate layer. This results in the maintenance of a high breakdown voltage across the source diffusion region 8 and the drain region 7.

As described, because the optimized junction and separation structure in this embodiment realizes the maintenance of a high breakdown voltage at the perimeter of the MOS section even with a well construction, high voltage MOSFETs with different conductivity types can be formed on one substrate. Therefore, a smart device will result, in which one chip will be able to include both a push-pull output and a bridge output.

The MOSFET with a CMOS construction shown in this embodiment is an example of adopting the high voltage MOSFET construction in this embodiment, with no limitations in its circuitry.

As described above, the present invention is constructed so that, even when a potential is applied between the semiconductor substrate, the gate layer and the source region of the first conductivity type, the drain region of the first conductivity type in the MIS section of the first conductivity type formed on the surface of the well of a second conductivity type and the semiconductor substrate to expand a first depletion layer from a junction face of the semiconductor substrate with the well, the leading edge of the depletion layer is positioned between the junction face and the drain region. In other words, the leading edge does not reach the junction face of the drain region with the well. Therefore, the invention has the following effects.

1) Because the breakdown voltage at the semiconductor substrate and between the source region and the drain region is kept high, the breakdown voltage is assured even if an MIS section of the first conductivity type or a control part is formed on one substrate, regardless of their operating conditions. Therefore, these high voltage MISFETs can realize a semiconductor device capable of both a push-pull output and bridge output from one chip.

2) When a potential is applied to a drain region, a semiconductor substrate and across a source region and a gate layer so that the second depletion layer from the junction face of the drain region and the well are connected together with the third depletion layer from the junction face of the semiconductor substrate and the well, the well directly below the drain region, is depleted which means that no region with a high electric field intensity is generated. Therefore, the breakdown voltage between the source region and the drain region is kept high, thereby enhancing the reliability of the above-mentioned semiconductor device.

3) When the drain region is equipped with a low-concentration drain region of the first conductivity type located opposite the source region, and a high-concentration drain region of the first conductivity type, and the gate layer is extended to the surface of a field oxide film thicker than the gate oxide film, and the source electrode electroconductively connected to the source region is also electroconductively connected to the high concentration contact region of the second conductivity type formed on the surface of the well, and when the electric field intensity relaxation layer of the second conductivity type is disposed on the surface of the low concentration drain region corresponding to the boundary between the gate oxide film and the field oxide film, the reliability of the semiconductor device can be improved in terms of its construction.

What is claimed is:

1. A semiconductor device equipped with a high-voltage metal-insulator-semiconductor field effect transistor (MISFET) comprising:

a well of a second conductivity type formed on a surface of a semiconductor substrate of a first conductivity type; and a metal-insulator-semiconductor (MIS) section of the first conductivity type formed on the surface of the well, said MIS section including a gate layer, a drain region and a source region of the first conductivity type;

wherein diffusion depths of said well and said drain region and impurity dosages thereof are set so that, when a high voltage is applied between said semiconductor substrate and the gate layer, the source region of the first conductivity type, and the drain region to expand a first depletion layer from a junction face of said semiconductor substrate with said well, a leading edge of said first depletion layer is positioned between said junction face and said drain region; and wherein the diffusion depths of said well and said drain region and the impurity dosages thereof are set so that when the high voltage is applied between said drain region and said semiconductor substrate, and said source region and said gate layer to expand a second depletion layer from a joint face of said drain region and said well and to expand a third depletion layer from a joint face of said semiconductor substrate with said well, the second and third depletion layers connect with each other to form an integrated depletion layer before avalanche breakdown can occur.

2. A semiconductor device equipped with a high-voltage MISFET as claimed in claim 1, wherein said drain region comprises a high concentration drain region of the first conductivity type and a low concentration drain region of the first conductivity type.

3. A semiconductor device equipped with a high-voltage MISFET as claimed in claim 1, wherein said drain region comprises a high concentration drain region of the first conductivity type, to which a drain electrode is electroconductively connected, that is formed in a low concentration drain region of the first conductivity type separated from said source region, said gate layer extends over a gate oxide film formed over a first portion of said low concentration drain region and over a surface of a field oxide film formed over a second portion of said low concentration drain region and a channel region located between said drain region and said source region, and wherein the field oxide film is thicker than the gate oxide film and a source electrode is electroconductively connected to said source region and to a contact region of the second conductivity type formed on the surface of said well.

4. A semiconductor device equipped with a high-voltage MISFET as claimed in claim 3, wherein a surface of said low concentration drain region facing the boundary of said gate oxide film and said field oxide film is disposed with an electric field strength relaxing layer of the second conductivity type.

5. A semiconductor device equipped with a high-voltage MISFET as claimed in claim 3, wherein said semiconductor substrate has an impurity concentration of the first conductivity type at about $3 \times 10^{14}$ ion/cm$^3$ or less, said well has the impurity dosage of the second conductivity type at about $3 \times 10^{13}$ ion/cm$^2$ or less, and said low concentration drain region has an impurity dosage of the first conductivity type at about $5 \times 10^{12}$ ions/cm$^2$ or less.

6. A semiconductor device equipped with a high-voltage MISFET as claimed in claim 3, wherein the diffusion depth of said well ranges from about 2 μm to about 10 μm, and said low concentration drain region has a diffusion depth ranging from about 0.5 μm to about 5 μm, and wherein a diffusion depth of said low concentration drain region is less than the diffusion depth of said well.

* * * * *